US012038479B2

(12) United States Patent
Turman et al.

(10) Patent No.: US 12,038,479 B2
(45) Date of Patent: Jul. 16, 2024

(54) STRESS-TESTING ELECTRICAL COMPONENTS USING TELEMETRY MODELING

(71) Applicant: Cisco Technology, Inc., San Jose, CA (US)

(72) Inventors: James Edwin Turman, Round Rock, TX (US); ShiJie Wen, Sunnyvale, CA (US); Jie Xue, Dublin, CA (US); Zoe Frances Conroy, Los Altos, CA (US); Dao-I Tony Lin, Pleasanton, CA (US); Anthony Winston, Akron, OH (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 17/941,386

(22) Filed: Sep. 9, 2022

(65) Prior Publication Data

US 2024/0085477 A1 Mar. 14, 2024

(51) Int. Cl.
*G01R 31/319* (2006.01)
*G01R 31/3183* (2006.01)
*G01R 31/3185* (2006.01)

(52) U.S. Cl.
CPC .......... *G01R 31/31903* (2013.01); *G01R 31/318342* (2013.01); *G01R 31/318594* (2013.01); *G01R 31/31905* (2013.01)

(58) Field of Classification Search
CPC ...... G01R 31/31905; G01R 31/318342; G01R 31/318594; G01R 31/31903
See application file for complete search history.

(56) References Cited

U.S. PATENT DOCUMENTS

| 11,650,244 B2* | 5/2023 | Aronoff | H01L 22/34 |
| | | | 324/762.05 |
| 2014/0156225 A1* | 6/2014 | Dagnino | G05B 23/0283 |
| | | | 702/183 |
| 2016/0377678 A1* | 12/2016 | Chen | G01R 31/31727 |
| | | | 714/726 |

(Continued)

FOREIGN PATENT DOCUMENTS

| TW | 201908747 A | 3/2019 |
| WO | 2020159539 A1 | 8/2020 |

OTHER PUBLICATIONS

Stoyan Stoyanov, et al., "Predictive Analytics Methodology for Smart Qualification Testing of Electronic Components," Springer, Journal of Intelligent Manufacturing, Dec. 24, 2018, 20 pages.

(Continued)

*Primary Examiner* — Steve N Nguyen
(74) *Attorney, Agent, or Firm* — Edell, Shapiro & Finnan, LLC

(57) ABSTRACT

A method, computer system, and computer program product are provided for stress-testing electronics using telemetry modeling. Telemetry data is received from one or more devices under test during a hardware testing phase, the telemetry data including one or more telemetry parameters. The telemetry data is processed using a predictive model to determine future values for the one or more telemetry parameters. Additional hardware testing is performed, wherein the additional hardware testing includes adjusting one or more testing components based on the determined future values.

20 Claims, 10 Drawing Sheets

(56) References Cited

U.S. PATENT DOCUMENTS

| | | | |
|---|---|---|---|
| 2017/0206469 A1* | 7/2017 | Das | G05B 13/048 |
| 2018/0300865 A1* | 10/2018 | Weiss | G06T 7/001 |
| 2020/0250057 A1 | 8/2020 | Lim et al. | |
| 2020/0387148 A1 | 12/2020 | Ghosh et al. | |
| 2022/0253375 A1* | 8/2022 | Rivoir | G06F 18/2148 |
| 2023/0022100 A1* | 1/2023 | Chen | G06N 3/0464 |

OTHER PUBLICATIONS

Christian Streitwieser, et al., "Semiconductor Test: Real-time Adaptive test algorithm can safely reduce wafer testing time and cost," Electronic Design, https://www.evaluationengineering.com/instrumentation/components/article/13013795/semiconductor-test-realtime-adaptive-test-algorithm-can-safely-reduce-wafer-testing-time-and-cost, May 19, 2016, 12 pages.

"IRC Overview," International Technology Roadmap for Semiconductors, 2013 Edition, 34 pages.

Jeff Anderson, et al., "On the Use of Usage Patterns from Telemetry Data for Test Case Prioritization," Information and Software Technology, May 22, 2019, 21 pages.

"Yang," Wikipedia, https://en.wikipedia.org/wiki/YANG, Feb. 1, 2022, 10 pages.

* cited by examiner

| 500 | | | |
|---|---|---|---|
| R-1_data.voltage_R0_DDR_current-reading | R-1_data.voltage_R0_VCCCPU_current-reading | R-1_data.voltage_R0_VNNNCPU_current-reading | CLUSTER |
| 510 | 520 | 530 | 540 |
| 0.666667 | 0.400 | 0.4375 | 1 |
| 0.555556 | 0.450 | 0.5000 | 1 |
| 0.666667 | 0.925 | 0.3750 | 0 |
| 0.333333 | 0.850 | 0.5625 | 0 |
| 0.666667 | 0.950 | 0.6875 | 1 |

FIG.5

STRESS-TESTING ELECTRICAL COMPONENTS USING TELEMETRY MODELING

TECHNICAL FIELD

The present disclosure relates to reliability, qualification, and ongoing reliability testing for electronic devices/products, such as networking devices and equipment.

BACKGROUND

In current electronic device product manufacturing processes, each product undergoes a thorough stress test process with multiple stages under various conditions, like particular combinations of temperatures, voltages, and the like, to ensure quality of a product. However, prior to volume production, new products are typically required to satisfy certain reliability criteria, such as operability in certain conditions, lifespan, and the like. A qualification process to ensure product design meet these customer operation conditions may involve a set of accelerated environmental and electrical stress testing for certain defined durations and sample sizes of the products, both at a component level and a system level.

Increased product complexity, supported by new silicon and component technologies, has expanded the need for sufficient coverage of testing, and has reduced the acceleration factor for reliability qualifications. Additionally, the complexity for diagnosing test-failing products has increased, resulting in higher qualification costs and longer qualification times. These trends have together increased a new product's time to market. There is a desire to minimize the time duration of qualification tests and the tested population size while demonstrating good product reliability to avoid failures in the field.

BRIEF DESCRIPTION OF THE DRAWINGS

FIG. 5 is a chart depicting labeled training data, according to an example embodiment.

DETAILED DESCRIPTION

Overview

Figure 1:
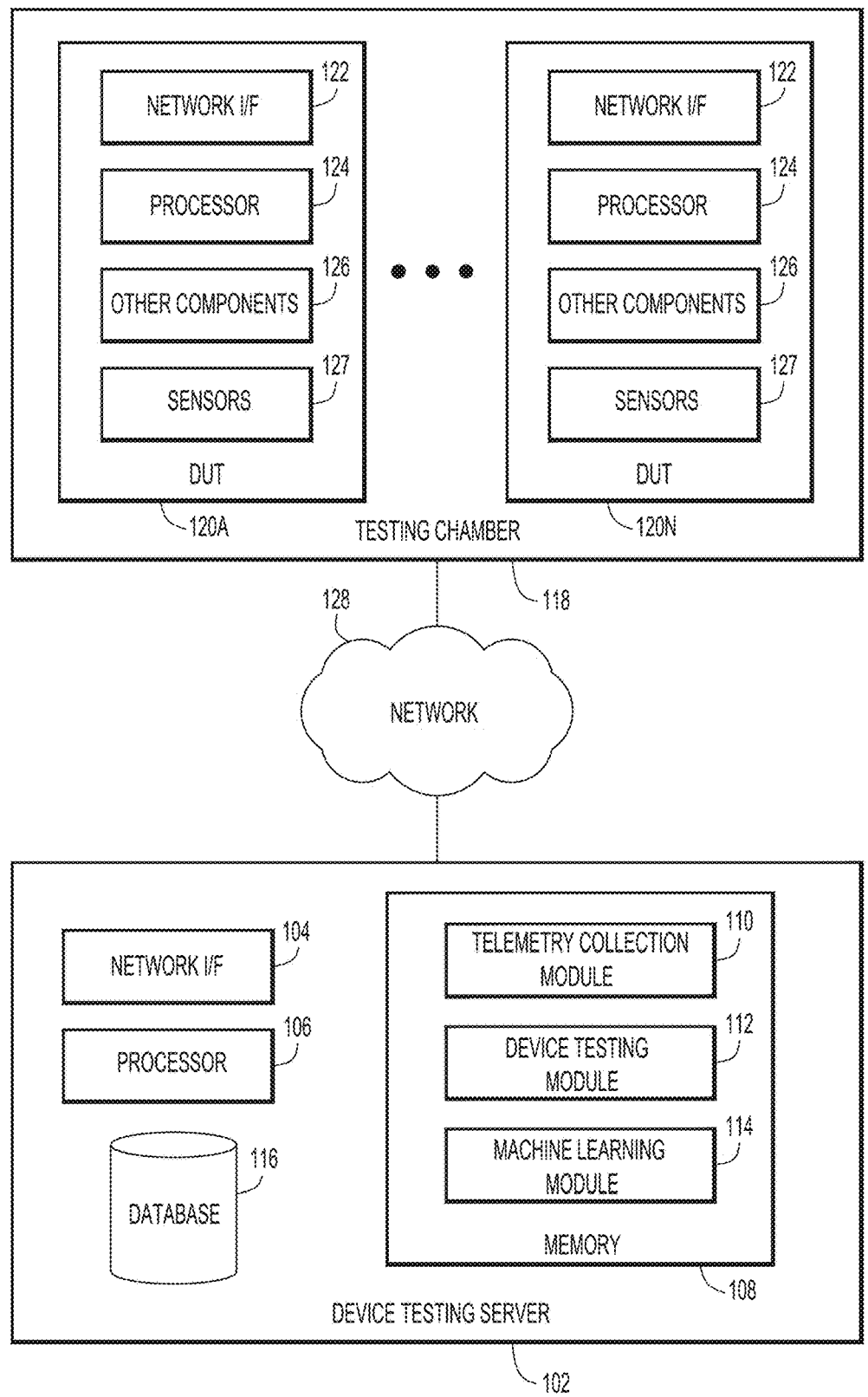
FIG. 1 is a block diagram of a testing environment, according to an example embodiment.

According to one embodiment, techniques are provided for stress-testing electrical components using telemetry modeling. Telemetry data is received from one or more devices under accelerated stress test during a hardware reliability qualification testing phase, the telemetry data including one or more telemetry parameters. The telemetry data is processed using a predictive model to determine future values for the one or more telemetry parameters. Additional hardware testing is performed, wherein the additional hardware testing includes adjusting one or more testing components based on the determined future values.

Example Embodiments

Before high volume product manufacturing, every product may undergo a thorough qualification testing process that involves multiple testing stages in which the products are exposed to various accelerated stress conditions, such as temperature extremes, voltage extremes, and the like. The purpose of these tests is to qualify the products to reliability commitment by electronics makers, and to ensure that only satisfactory products are ultimately used in customer networks. The degree of a product's reliability is judged by how the products pass or fail these testing stages.

Thus, conventional approaches attempt to accelerate the stresses that a device will incur in its lifespan in order to establish that a product is reliable. However, obtaining sufficiently-large populations at an early stage of design (e.g., when a product may be a prototype) is expensive in terms of both costs and time taken. For example, testing a particular semiconductor device may require several lots and numerous units per lot, with each lot being exposed to high temperatures and/or voltages for over one thousand hours. Additionally, running reliability tests for such extended periods itself requires resource expenditures (e.g., energy, opportunity costs to test other devices in the same chambers, etc.).

Accordingly, presented herein are techniques for testing products in a manner that captures telemetry data from the products and combines the data with predictive analytics to significantly decrease the investment of expensive test equipment and chambers, and decrease product test time substantially. In particular, a machine learning model is trained to analyze the telemetry data and predict future results of testing a group of devices without having to actually conduct a long-duration test. Present embodiments thus provide several practical applications, including the ability to achieve a faster time-to-market for new components, an improvement to product field reliability, and an improvement to engineering efficiencies. Moreover, the techniques presented herein provide a hardware reliability model for behavior and margin testing during a product's development phase, which can be used during high-volume manufacturing for the reduction of margin testing and efficacy of On-going Reliability Testing (ORT) and/or other tests that are documented by organizations such as the Joint Electron Device Engineering Council (JEDEC). Accordingly, present embodiments improve the technical field of design and testing of electronic devices by greatly reducing the cost and time requirements for testing products to ensure that the products are fit for consumer usage.

It should be noted that references throughout this specification to features, advantages, or similar language herein do not imply that all of the features and advantages that may be realized with the embodiments disclosed herein should be, or are in, any single embodiment. Rather, language referring to the features and advantages is understood to mean that a specific feature, advantage, or characteristic described in connection with an embodiment is included in at least one embodiment. Thus, discussion of the features, advantages, and similar language, throughout this specification may, but do not necessarily, refer to the same embodiment.

Furthermore, the described features, advantages, and characteristics may be combined in any suitable manner in one or more embodiments. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages will become more fully apparent from the following drawings, description and appended claims, or may be learned by the practice of embodiments as set forth hereinafter.

Embodiments will now be described in detail with reference to the Figures. FIG. 1 is a block diagram of a testing environment 100, according to an example embodiment. As depicted, testing environment 100 includes a device testing server 102, a testing chamber 118 with one or more devices under test (DUTs) 120A-120N, and a network 128. It is to be understood that the functional division among components of testing environment 100 have been chosen for purposes of explaining various embodiments and is not to be construed as a limiting example. The device testing server 102 may, in some embodiments, be more directly connected to the testing chamber 118 rather than a connection via network 128.

Device testing server 102 includes a network interface (I/F) 104, at least one processor 106, memory 108, and a database 116. Memory 108 stores software instructions for a telemetry collection module 110, a device testing module 112, and a machine learning module 114. Device testing server 102 may include a rack-mounted server, or any other programmable electronic device capable of executing computer readable program instructions. Network interface 104 enables components of device testing server 102 to send and receive data over a network, such as network 128. In general, device testing server 102 collects telemetry data and analyzes telemetry data using one or more machine learning models to predict whether devices' reliability metrics meet qualification requirement. Device testing server 102 may include internal and external hardware components, as depicted and described in further detail with respect to FIG. 10.

Telemetry collection module 110, device testing module 112, and machine learning module 114 may include one or more modules or units to perform various functions of the embodiments described below. Telemetry collection module 110, device testing module 112, and machine learning module 114 may be implemented by any combination of any quantity of software and/or hardware modules or units, and may reside within memory 108 of device testing server 102 for execution by a processor, such as processor 106.

Telemetry collection module 110 may collect, pre-process, and/or organize telemetry data obtained from devices being tested (e.g., DUTs 120A-120N). The telemetry data may include any data that is collected, streamed from, or otherwise obtained from network-accessible devices, such as DUTs 120A-120N or other devices. Telemetry data may include data that indicates a current state or functioning of devices, including software and/or hardware states. In some embodiments, the telemetry data may include data obtained from sensors of devices, such as voltage data, temperature data, current data, and the like. Additionally or alternatively, telemetry data may include data that indicates or relates to resource utilization of devices, such as processor utilization, memory utilization, bandwidth utilization, storage utilization, and the like. In some embodiments, telemetry data may indicate any errors encountered by devices, and as such, may include error log data, uptime data, and other collectible data relating to errors or other disruptions in functionality.

The telemetry data collected by telemetry collection module 110 may include any data that is collected and streamed in real-time or near real-time from devices. In particular, the telemetry data can include model-driven telemetry data, which is an approach to network monitoring in which data is streamed from network devices continuously using a push model, thus providing real-time or near real-time access to operational statistics of network-accessible devices.

In some embodiments, the telemetry data adheres to a particular data model, such as the Yet Another Next Generation (YANG) data model. Accordingly, telemetry collection module 110 may subscribe to particular YANG paths of interest in each device from which telemetry data is collected, thereby receiving time-series data in real-time or near real-time according to the cadence at which the telemetry data is set.

Telemetry collection module 110 may store the telemetry data according to a time-series data format. In some embodiments, telemetry collection module 110 stores the data in database 116. Telemetry collection module 110 may organize the data by device so that time-series data can be analyzed or otherwise processed on a per-device level, or the data can be organized by groups of devices. In some embodiments, telemetry collection module 110 may perform pre-processing on collected data, such as discarding known bad data, converting data from one format to another, normalizing data, generating additional data using statistical analysis (e.g., generating moving averages of particular values over specified timespans), and the like.

In some embodiments, telemetry gathered by telemetry collection module 110 may include data obtained from messages transmitted during run-time of devices. Run-time data may be obtained during testing, in a customer network, and the like. Telemetry can be transmitted either via a pull (e.g., request) method, in which another device requests the telemetry data, or via a push method in which a device under test outputs the data in a predetermined manner (e.g., according to a schedule, or streaming the data as the data becomes available). Present embodiments may use various data models, including YANG, as well as Command Line Interface (CLI), Data Management Engine (DME), Telemetry Data Log (TDL), Simple Network Management Protocol (SNMP), and the like.

Device testing module 112 may cause devices to be tested in accordance with present embodiments and/or may determine whether devices that are tested (e.g., DUTs 120A-120N) have passed or failed their tests. In some embodiments, device testing module 112 may transmit instructions to testing chamber 118 to initiate particular testing sequences, such as specific voltage and/or temperatures tests, and the like. The instructions transmitted by device testing module 112 may include specific environmental features to apply to devices inside of testing chamber 118, such as particular temperatures, voltages, pressures, and/or combinations thereof. In some embodiments, device testing module 112 may transmit instructions that specify time durations at which devices should be subject to particular temperatures, voltages, pressures, and the like.

In some embodiments, device testing module 112 determines which devices should be included in a particular test. In particular, device testing module 112 may specify particular types of devices, counts of devices by type, and/or specific individual devices (e.g., by unique identifier) that should be included in a particular test. The testing conditions to which devices are subjected in a test can be predetermined or determined based on output of machine learning module 114, which can indicate whether certain devices should be excluded from additional testing and/or can indicate particular test conditions (e.g., temperature values, voltage values), for one or more of the devices during a test. When a test is initiated, device testing module 112 may transmit instructions to telemetry collection module 110 to begin collecting telemetry.

Additionally or alternatively, device testing module 112 may determine, either during or at an end of a test, a pass or fail criterion for one or more of the individual devices, or models of devices, included in a particular test. Based on telemetry data collected by telemetry collection module 110, and/or based on predicted telemetry data generated by machine learning module 114, device testing module 112 may determine, on a device-by-device basis or on a device model-basis, whether each device or model of device has passed or failed a particular test by comparing the telemetry data to pass or fail threshold values. Telemetry collection module 110 may perform additional processing of telemetry data, such as averaging values, counting instances of values that exceed thresholds values, and the like, in order to determine whether devices pass or fail a test. For example, a device may fail a test if the device encounters an error at a particular temperature and voltage combination, if the device encounters an error a particular number of times at a particular temperature and voltage combination, or if the device encounters any error at all during testing, etc.

In manufacturing production processes, telemetry data is streamed from each DUT (e.g., DUTs 120A-120N) controlled by the manufacturing test platform (e.g., device testing module 112). Product parametric telemetry data includes data based on internal component parameters such as temperature, current, voltage, CPU utilization, etc., and external parameters such as traffic rate, packet drops, and ambient environmental conditions (e.g., temperature, current, humidity, etc.). There are several methods of streaming the telemetry data from the DUTs 120A-120N. As the product telemetry data is streamed from the DUT, the telemetry data may be processed and formatted to allow the real-time predictive analysis of the data against the pre-engineered machine-learning model (e.g., machine learning module 114). The collection of streamed parametric data from each specific DUT test station/area before the test station may allow for constructing a unique and highly accurate machine learning (ML) model particular for each product type or category of product (e.g., computing device (laptop, smartphone, etc.), network device (e.g., router, switch, model, etc.), etc.). The optimized ML model may possess the functionality using multiple data science algorithms to identify future sensor values for DUTs 120A-120N based on previous and/or current sensor values.

Machine learning module 114 may train and/or apply one or more machine learning models in accordance with present embodiments. In some embodiments, machine learning module 114 includes a predictive model that has inputs of telemetry data collected from devices being tested (e.g., DUTs 120A-120N) and outputs predicted future telemetry values. The predictive model may be trained using training data that includes examples of telemetry data collected from devices over time. Accordingly, based on the examples provided in the training data, machine learning module 114 can be trained to output a value that estimates future sensor readings as if a device had actually undergone a full-length test. Additionally, the machine learning model can extrapolate the number of devices, thereby enabling a larger set of devices to be modeled using the telemetry data of a small set of devices. The machine learning model(s) employed to analyze devices are depicted and described in further detail with respect to FIGS. 3-7 and 9.

The output of machine learning module 114 can be used to adjust current or future tests. In particular, the output values of machine learning module 114 can be provided to device testing module 112 to determine whether certain values, such as temperature values, voltage values, current values, etc., should be raised or lowered in a current or subsequent test. Additionally or alternatively, the durations of tests, composition of tests (e.g., count of devices), and/or sequences within tests may be modified based on the output values of machine learning module 114. Accordingly, the output values of machine learning module 114 can be used to make current or subsequent tests more or less rigorous in order to achieve desired testing goals.

Database 116 may include any non-volatile storage media known in the art. For example, database 116 can be implemented with a tape library, optical library, one or more independent hard disk drives, or multiple hard disk drives in a redundant array of independent disks (RAID). Similarly, data in database 116 may conform to any suitable storage architecture known in the art, such as a file, a relational database, an object-oriented database, and/or one or more tables. Database 116 may store data including telemetry data, training data for machine learning models, registries of devices and associated pass or fail criteria for tests, testing instructions, and the like.

Testing chamber 118 may include any structure in which the environmental or other parameters of tested devices (e.g., DUTs 120A-120N) can be controlled. In various embodiments, testing chamber 118 may include an insulated container, hyperbaric chamber, hermetically-sealed chamber, and the like. Testing chamber 118 may include an interface for each device being tested so that electrical power and/or instructions can be provided to the devices. Testing chamber 118 may support communication between tested devices and a network, such as network 128. In various embodiments, testing chamber 118 may enable internal and/or external parameters of devices to be modified to expose devices to various parameters, including a temperature parameter, a voltage parameter, a pressure parameter, an electric current parameter, a capacitance parameter, a gyroscopic parameter, a microelectromechanical system (MEMS) parameter, a stress/strain parameter, a traffic rate parameter, a packet drop rate parameter, and an ambient environmental condition (e.g., temperature, humidity, etc.) parameter. Testing chamber 118 may include conventional or other components to achieve modification of desired parameters, including heating elements, air conditioning units, vacuum pumps, compressors, voltage regulators, mechanical agitators, hydraulics, and the like.

Devices under test (DUTs) 120A-120N each include a network interface (I/F) 122, at least one processor 124, other components 126, and one or more sensors 127. Each DUT 120A-120N may include a laptop computer, a tablet computer, a netbook computer, a personal computer (PC), a desktop computer, a personal digital assistant (PDA), a smart phone, a video conferencing endpoint device, a router, a switch, a rack-mounted server, or any other programmable electronic device capable of executing computer readable program instructions. Network interface 104 enables each DUT 120A-120N to send and receive data over a network, such as network 128. In general, DUTs 120A-120N are provided to testing chamber 118 and subjected to a variety of hardware tests, software tests, and internal and external parameters in order to evaluate performance of DUTs 120A-120N. Each DUT 120A-120N may include internal and external hardware components, as depicted and described in further detail with respect to FIG. 10. The other components 126 may include any conventional or other components that are included in computing or networking devices, including displays, microphones, speakers, cameras, memory, non-volatile storage, MEMS components, and the like.

Sensors 127 may include any transducer or other component that can convert a measurable phenomenon into a signal. In various embodiments, sensors 127 may include a heat sensor, a voltage sensor, a current sensor, a pressure sensor, a sound sensor, and the like. Sensors 127 may additionally include a software-implemented component, such as a network traffic monitor, a processor utilization monitor, a memory utilization monitor, and the like.

Network 128 may include a local area network (LAN), a wide area network (WAN) such as the Internet, or a combination of the two, and includes wired, wireless, or fiber optic connections. In general, network 128 can be any combination of connections and protocols known in the art that will support communications between device testing server 102 and/or DUTs 120A-120N via their respective network interfaces in accordance with the described embodiments.

Figure 2:
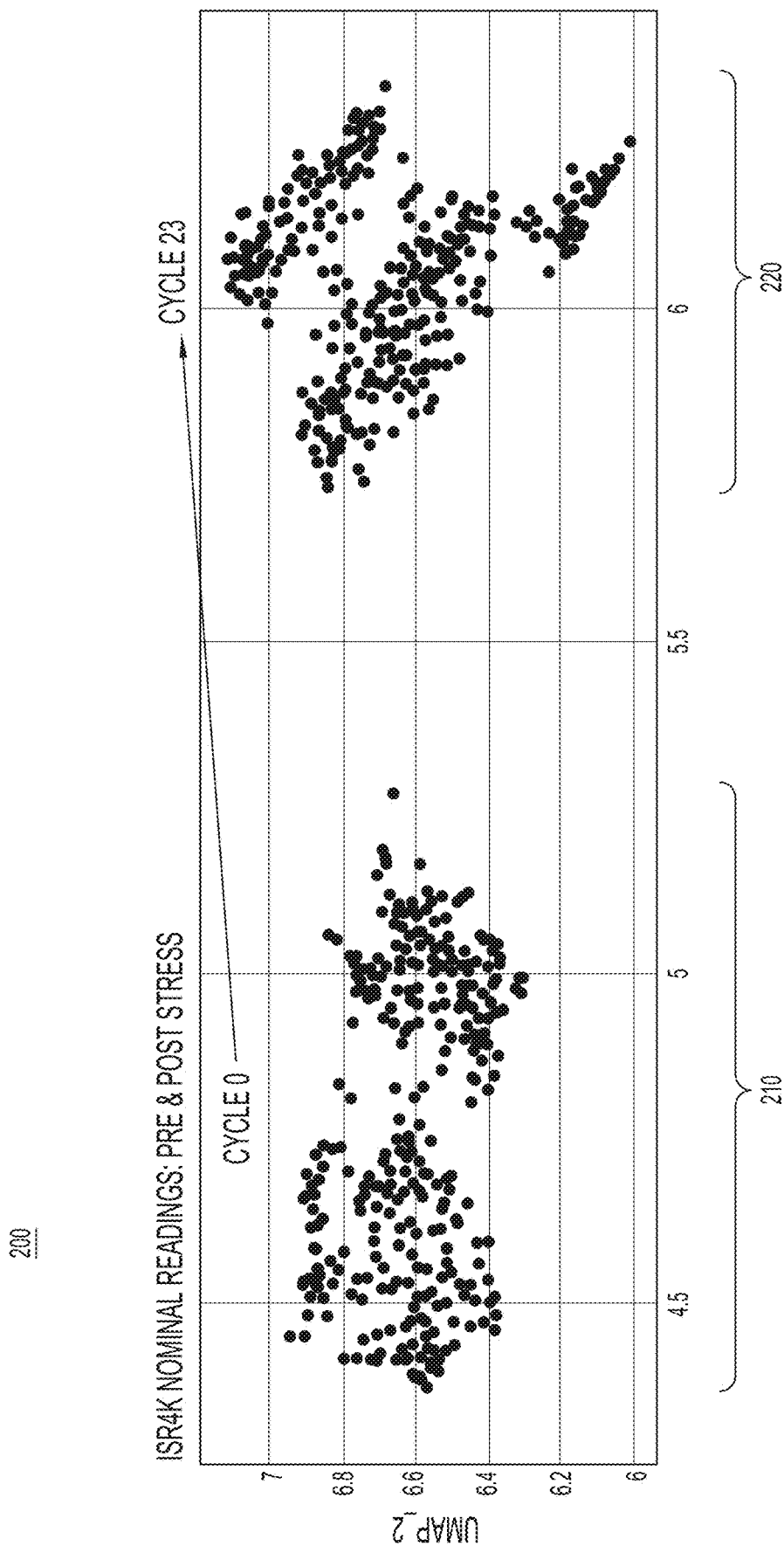
FIG. 2 is a diagram illustrating sensor readings before and after a stress test after applying a Uniform Manifold Approximation and Projection (UMAP) algorithm, according to an example embodiment.

Reference is now made to FIG. 2. FIG. 2 is a diagram 200 illustrating sensor readings before and after a stress test after applying a Uniform Manifold Approximation and Projection (UMAP) algorithm, according to an example embodiment. As depicted, diagram 200 includes a plurality of data points corresponding to sensor readings of devices under test. In the depicted example, the sensor readings may include sensors such as temperature sensors, voltage sensors, and the like; the testing may expose each device under test to multiple cycles of stresses (e.g., thermal stress, mechanical stress, voltage stress, traffic stress, etc.). As depicted, the sensor readings include two primary clusters, a cluster 210 corresponding to an initial cycle (i.e., "cycle 0") and a cluster 220 corresponding to a final cycle (i.e., "cycle 23"). Accordingly, diagram 200 depicts the resulting drift in sensor readings over the course of twenty-four cycles of stress testing. In particular, the values drifted toward the upper-right over the course of testing. These sensor values can be used to train a predictive model in accordance with present embodiments in order to generate predicted values, which would closely match the valves of cycle 23, based on previous or current values (e.g., sensor values obtained at cycle 0).

Figure 3:
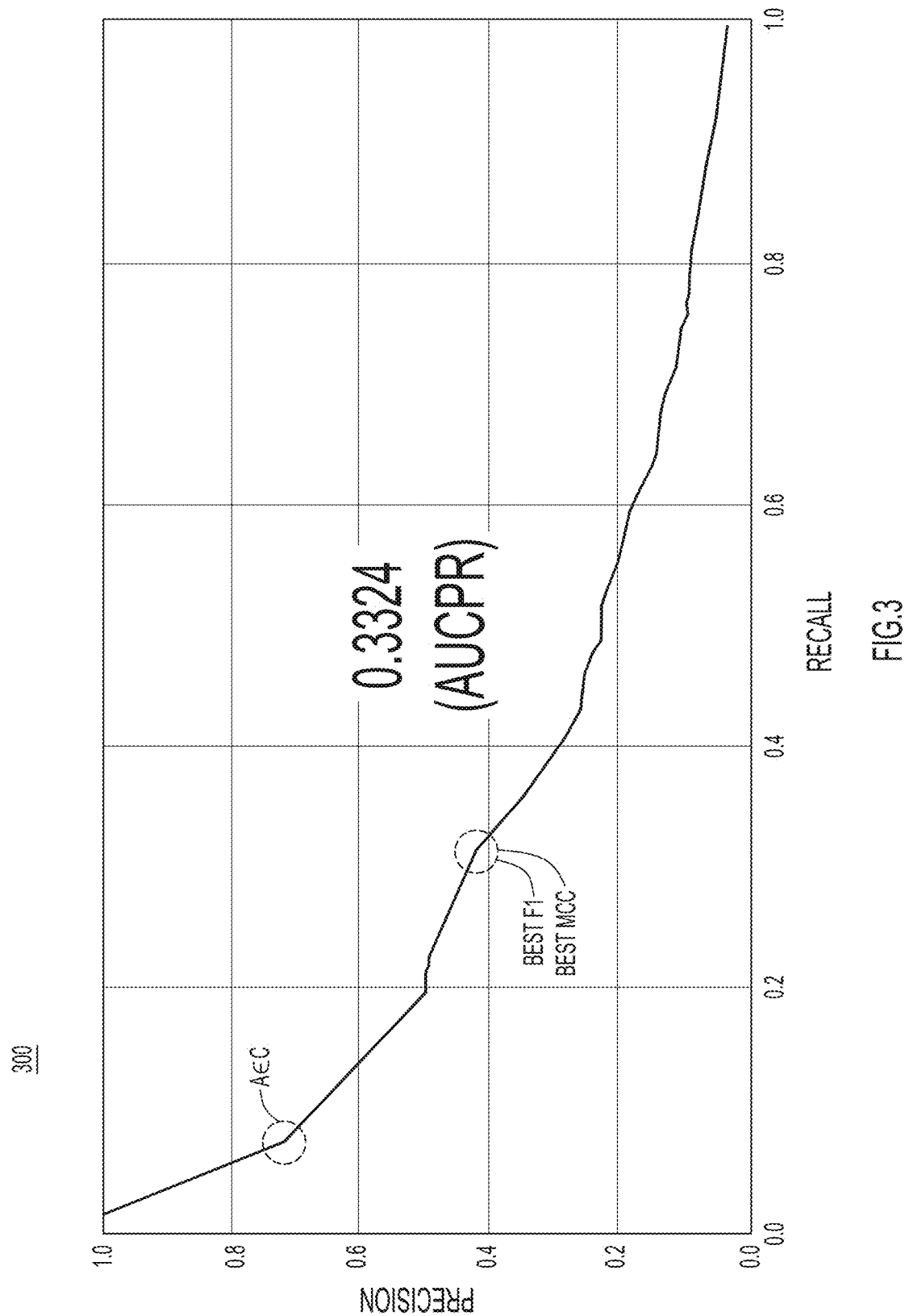
FIG. 3 is a diagram illustrating a precision-recall curve, according to an example embodiment.

FIG. 3 is a diagram illustrating a precision-recall curve 300, according to an example embodiment. As depicted, curve 300 includes axes of recall and precision. In this example, the area under the precision-recall curve (AUCPR) is indicated as 0.3324, and the F 1 score and the Matthew's correlation coefficient (MCC) are approximately 0.4. Curve 300 may be constructed by measuring the ratio (i.e., precision) of selected tested units predicted to fail a test to those that actually failed a test. As indicated by the values of curve 300, telemetry modeling in accordance with present embodiments achieves higher precision then random sampling, indicating that fewer units need to be sampled (and therefore, included in a test) in order to achieve the same product reliability testing goals.

Figure 4:
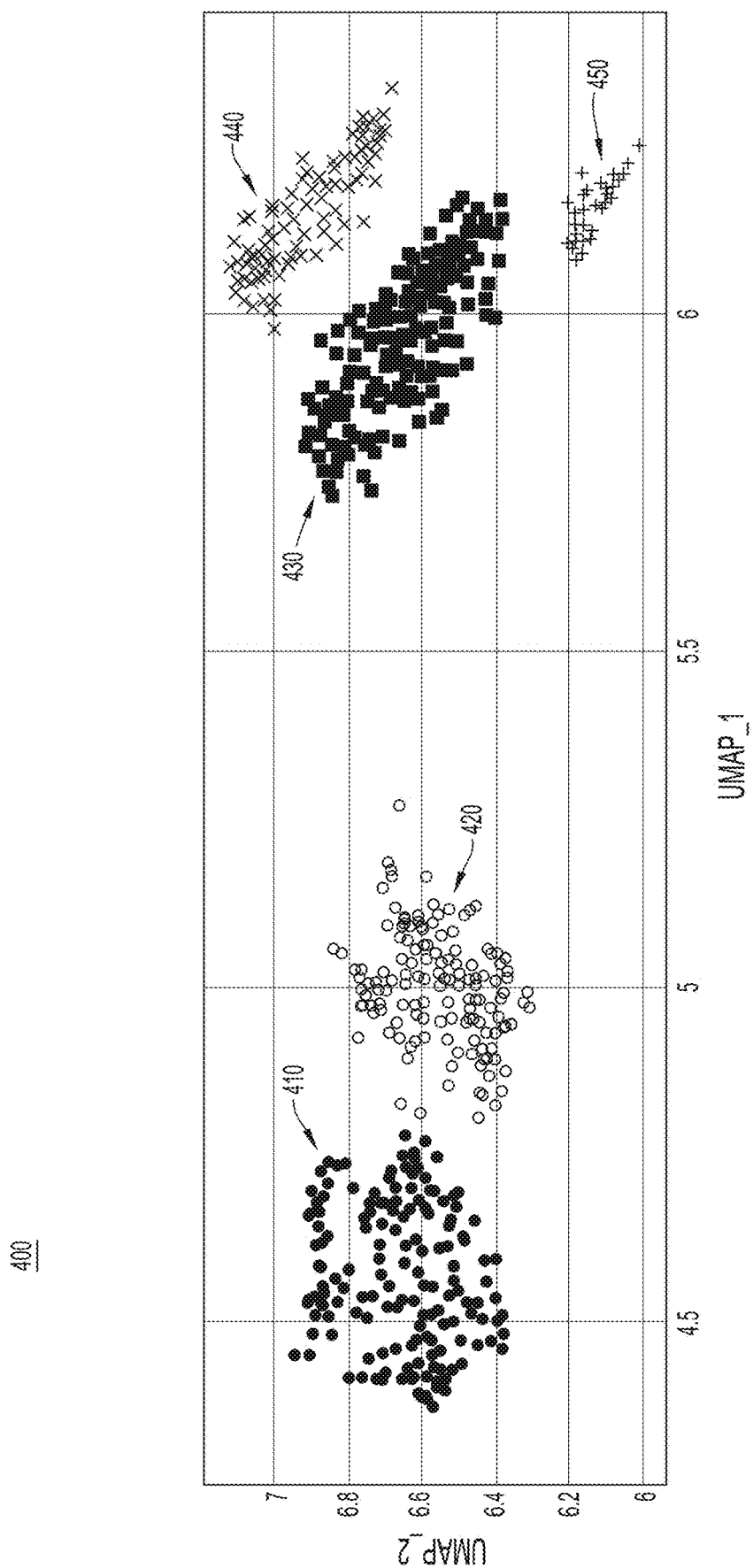
FIG. 4 is a diagram illustrating clusters of sensor readings after applying a UMAP algorithm, according to an example embodiment.

Turning now to FIG. 4, a diagram 400 illustrates clusters of sensor readings after applying a UMAP algorithm, according to an example embodiment. As depicted, diagram 400 includes sensor readings that correspond to clusters 410, 420, 430, 440, and 450. A clustering algorithm may process sensor readings in order to identify each cluster. Diagram 400 may be constructed by obtaining time-series telemetry data from each tested device (e.g., DUTs 120A-120N), scaling each data to a same range (e.g., zero to one), and performing dimensionality reduction. The dimensionality reduction may include a conventional or other approach, such as Uniform Manifold Approximation and Projection (UMAP), which can reduce the dimensionality of each sensor value to two dimensions, thereby enabling telemetry data from disparate types of sensors to be arranged according to diagram 400.

Next, these two-dimensional embeddings can be clustered via a conventional or other clustering algorithm, such as Density Based Spectral Clustering of Applications with Noise (DBSCAN) or other clustering techniques. The centroids of each cluster can be determined in order to identify the cluster that corresponds to furthest distance from the centroid of the initial cluster, which corresponds to the sensor values of devices that drifted the most during testing.

Turning now to FIG. 5, a chart 500 depicts labeled training data, according to an example embodiment. The training data can include a plurality of sensor readings (e.g., voltage sensor readings 510, 520, and 530) for time-series telemetry data; in the depicted example, each row may correspond to a different time during a test. Additionally, each row may be labeled with the cluster identity 540 of the cluster to which the telemetry data corresponds (e.g., using a clustering approach that is depicted and described with regard to FIG. 4). Thus, the training data can be used to train a classifier to predict the cluster to which a device will belong given a single row of sensor data. Accordingly, devices that will be associated with the most drift during testing can be identified and selected as most relevant for subsequent testing. For example, since the devices whose sensor readings drift the most are more likely to be prone to failure, a test can include only those devices, thus reducing the sample size of testing devices.

Figure 6:
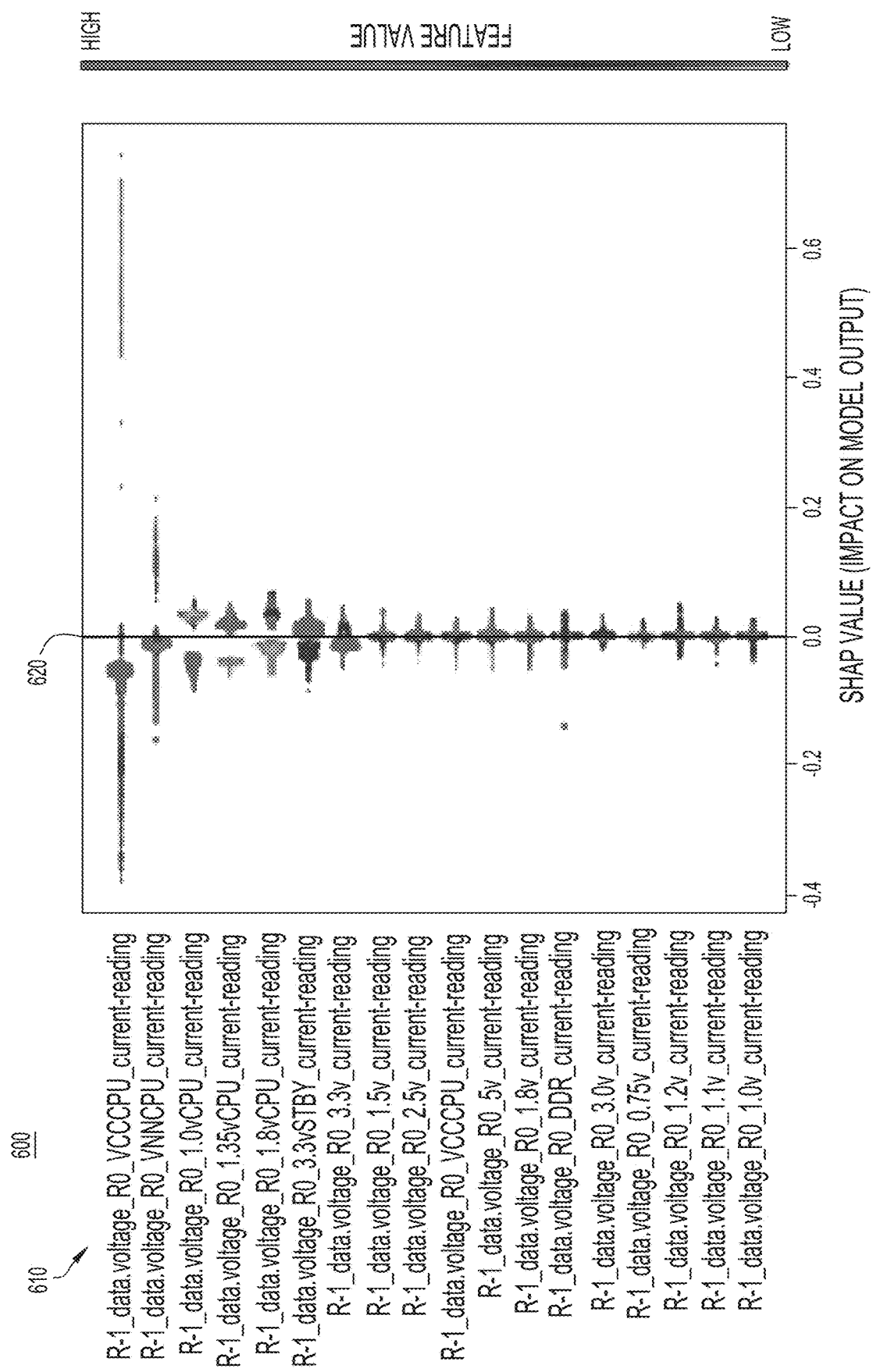
FIG. 6 is a diagram illustrating Shapley additive explanation (SHAP) values, in accordance with an example embodiment.

FIG. 6 is a diagram 600 illustrating Shapley additive explanation (SHAP) values, in accordance with an example embodiment. A Shapley explainer may be employed to fit a trained machine learning model (e.g., a random forest model) in order to identify the sensor behavior for each cluster. Depicted in diagram 600 is an example cluster of sensor data by each sensor 610, with a corresponding SHAP value 620 plotted according to the impact of each sensor's data on the cluster. In the depicted example, the first sensor 610 has a top voltage value that is much lower than the rest of the test data. Accordingly, the most impactful sensors can be identified.

Figure 7:
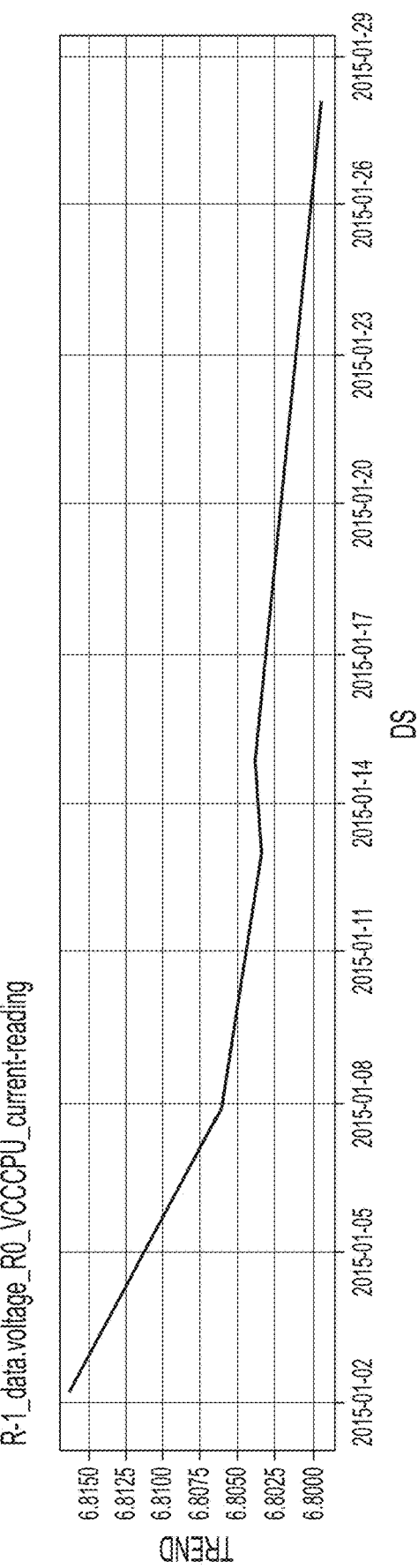
FIG. 7 is a diagram illustrating a decomposed sensor trend over time, in accordance with an example embodiment.

FIG. 7 is a diagram 700 illustrating a decomposed sensor trend over time, in accordance with an example embodiment. As depicted, the voltage of the sensor trends down over time. Diagram 700 may be constructed using a time-series model, such as fbProphet, which is fit to determine the trend, as well as other useful metrics, such as the seasonality of any patterns. The model can then be employed to produce a forecast for sensor values, which can be useful in adjusting testing parameters for subsequent tests. Thus, outcomes of devices under test can be predicted, thereby enabling tests to be shortened.

Figure 8:
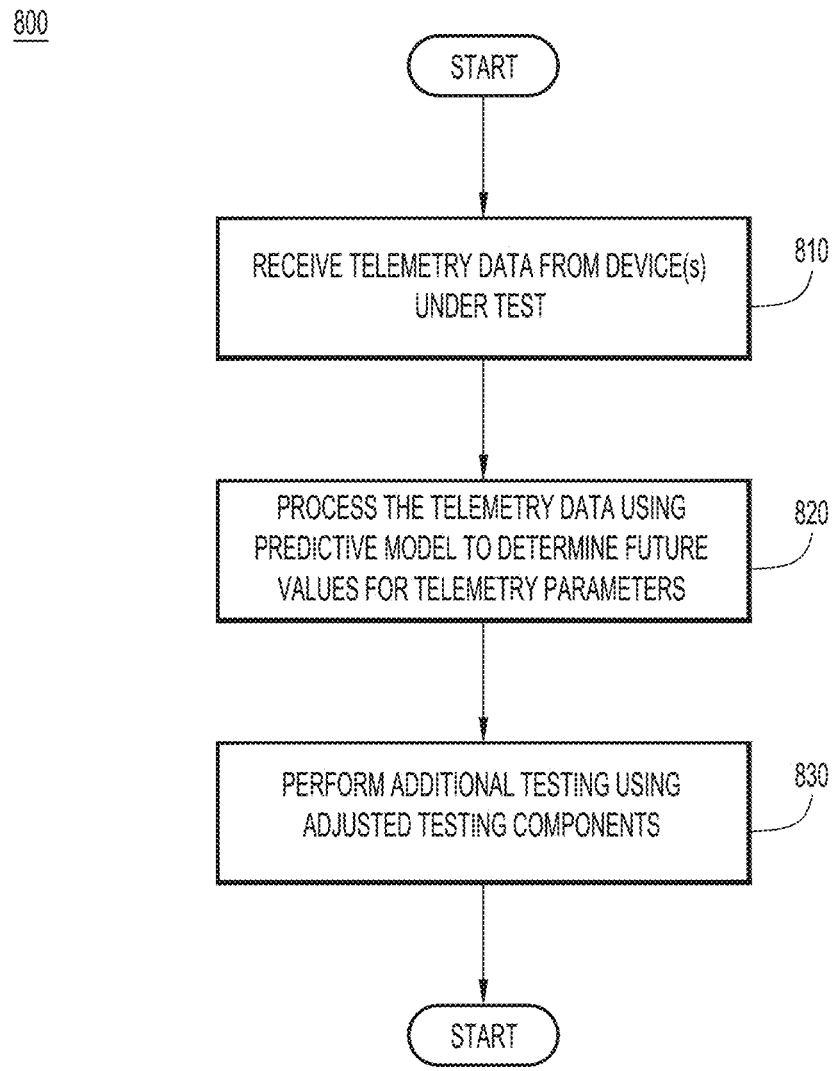
FIG. 8 is a flow chart of a testing process using a machine learning model, according to an example embodiment.

Turning now to FIG. 8, a flow chart 800 is provided for a testing process using a machine learning model, according to an example embodiment.

Telemetry data is received from one or more devices under test at operation 810. Initially, telemetry data may be obtained from one or more devices that are being subjected to testing conditions, which can include exposure to various temperatures, voltages, current, network traffic, and the like. The testing can be performed in a series of cycles or phases, and different conditions can be tested for each cycle. The telemetry data that is obtained may include streaming telemetry data (e.g., data that is pushed from the device rather than requested by another device), and the telemetry data may be stored in a time-series manner in which each datum is associated with a particular time and/or a particular sensor from which the datum was obtained.

The telemetry data is processed using a predictive model to determine future values for telemetry parameters at operation 820. A predictive model can be trained to take inputs of current or previous sensor values and to extrapolate future values for each sensor that predict each sensor's output at a later time of testing. For example, sensor data from a tenth cycle may be sufficient to accurately model device behavior at a twenty-fourth or later cycle. Thus, the effects of testing can be extrapolated.

Additional testing is performed using adjusted testing components at operation 830. Based on the future sensor values predicted by the predictive model, testing can be reduced in terms of duration of each test and/or the count of devices subjected to the test. In some embodiments, the predicted future sensor values are used to determine whether a product passes or fails a qualification test rather than awaiting the actual future sensor values, thereby enabling the duration of a test to be shortened. Additionally or alternatively, by identifying sensors whose sensor values are likely to deviate the most from the initial values, the count of devices can be reduced by omitting any devices that are not associated with sensor values that drift greatly during a test. In some embodiments, the future sensor values are compared to one or more threshold values to determine pass or fail criteria for a product.

Figure 9:
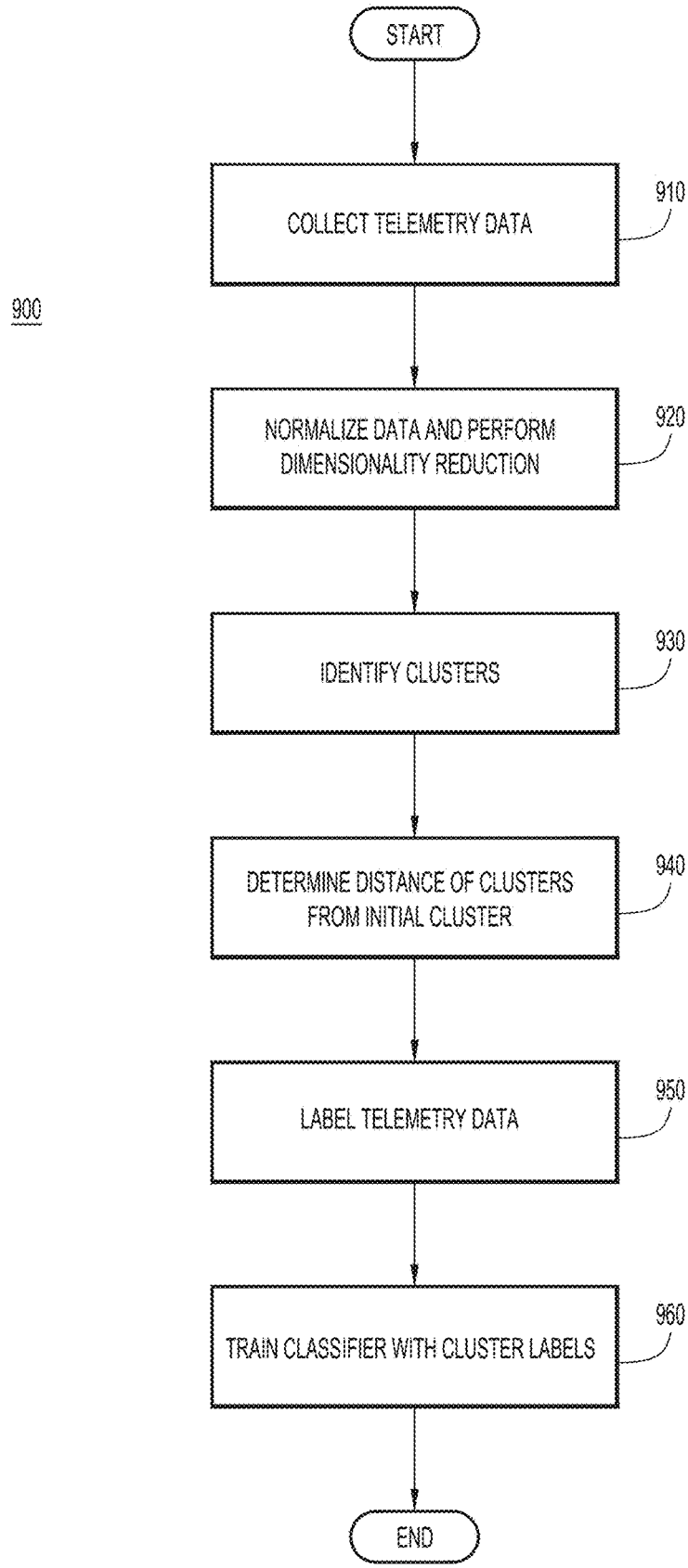
FIG. 9 is a flow chart of a method of training and applying a machine learning model, according to an example embodiment.

FIG. 9 is a flow chart of a method 900 of training and applying a machine learning model, according to an example embodiment.

Initially, telemetry data is collected at operation 910. The telemetry data can be collected from one or more sample tests that are used to generate the data, which can be used to train a predictive model for future testing purposes. The telemetry data may be organized as time-series data and may be labeled with respect to the device and/or the sensor from which each datum was collected. As an example, telemetry data collected during a test is depicted and described in further detail with reference to FIG. 2.

The telemetry data is normalized and dimensionality reduction is performed at operation 920. Since data may be obtained from a variety of sensors and may measure different parameters (e.g., voltage, temperature, etc.), the data may first be normalized in order to enable comparisons between sensors. For example, all data may be normalized to a same range, such as zero to one, or zero to one hundred. Dimensionality reduction can be performed using a UMAP approach or other technique in order to condense sensor parameters to two dimensions.

Clusters are identified in the data at operation 930. A clustering algorithm such as DB SCAN may be employed to identify clusters that arise when the sensor data is normalized and reduced to a dimensionality of two. Once clusters are identified, the data values for sensor readings in each cluster can be processed to identify an overall centroid for each cluster. As an example, clustering of telemetry data is depicted and described in further detail with reference to FIG. 4.

The distance of each cluster from the initial cluster is determined at operation 940. The centroid of each cluster can be compared to the centroid of the initial cluster in order to obtain a measure of how far each cluster's sensor values drifted from the initial conditions (e.g., at the onset of testing). One or more clusters that have drifted a farthest distance from the initial cluster may be selected, and the devices corresponding to those clusters may be included in additional testing, whereas devices that do not drift far from initial values may be omitted from additional testing.

The telemetry data is labeled at operation 950. The time-series data for each sensor can be labeled with respect to the cluster in which the values ultimately drifted. This data can then be used as training data to train a model, such as a random forest model, multi-label classifier, or other machine learning model, to predict a cluster to which sensor data should be assigned. One example of labeled telemetry data is depicted and described in further detail with reference to FIG. 5.

A classifier is trained using the telemetry data that is labeled by cluster at operation 960. Thus, new sensor data can be used to predict a cluster, and therefore, to forecast the drift of the new sensor data without having to actually subject the device to a number of cycles of testing. Accordingly, the resulting trained model can forecast sensor data as well as identify any particularly relevant sensors (and therefore, devices), enabling the duration of testing as well as the count of devices included in testing to be reduced.

Figure 10:
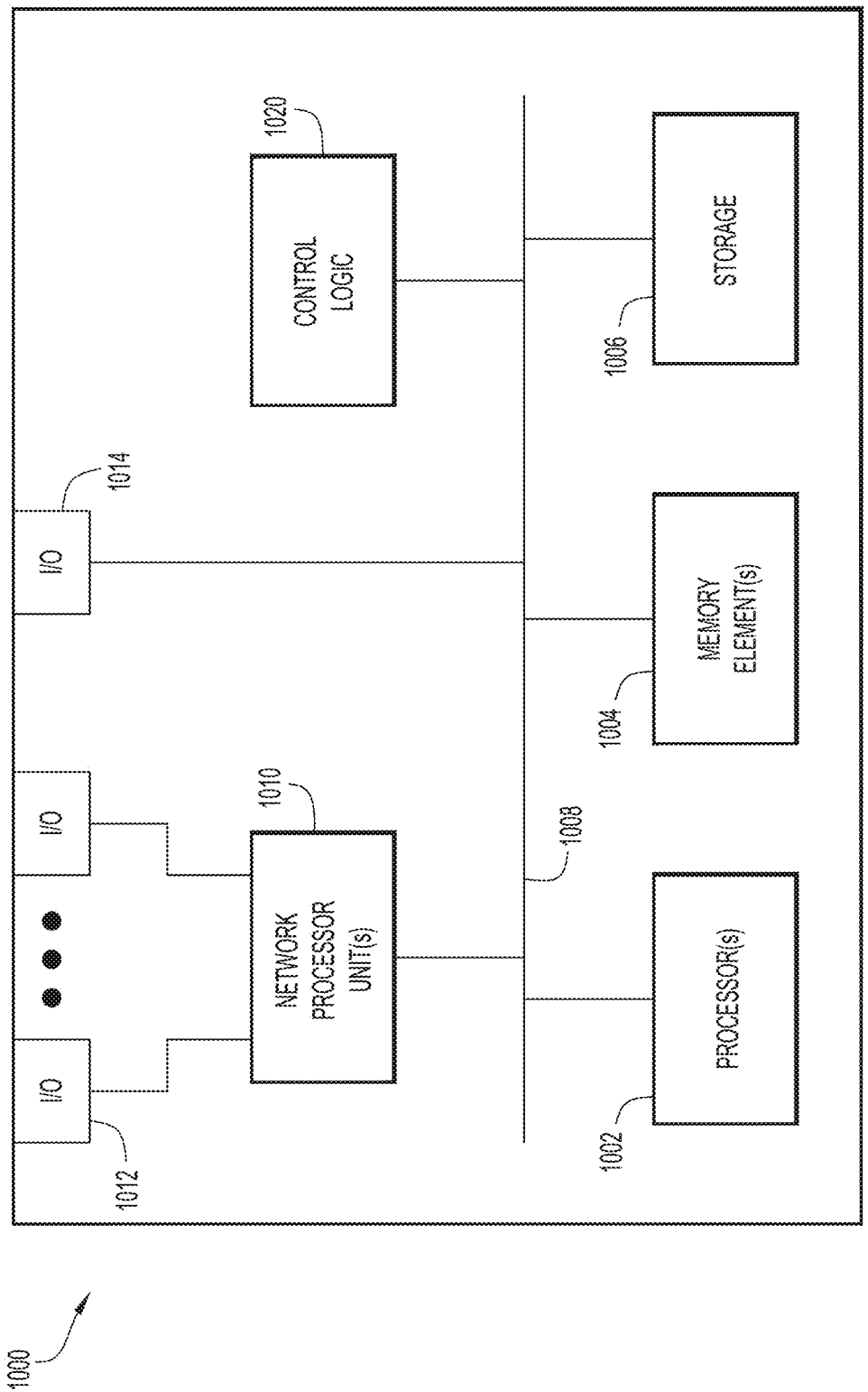
FIG. 10 is a block diagram of a device that may be configured to perform the machine-learning and testing-related computations of the testing process presented herein.

Referring now to FIG. 10, a block diagram is shown of a computing device 1000 that may perform functions associated with testing process discussed herein in connection with FIGS. 1-9.

In at least one embodiment, the computing device 1000 may include one or more processor(s) 1002, one or more memory element(s) 1004, storage 1006, a bus 1008, one or more network processor unit(s) 1010 interconnected with one or more network input/output (I/O) interface(s) 1012, one or more I/O interface(s) 1014, and control logic 1020. In various embodiments, instructions associated with logic for computing device 1000 can overlap in any manner and are not limited to the specific allocation of instructions and/or operations described herein.

In at least one embodiment, processor(s) 1002 is/are at least one hardware processor configured to execute various tasks, operations and/or functions for computing device 1000 as described herein according to software and/or instructions configured for computing device 1000. Processor(s) 1002 (e.g., a hardware processor) can execute any type of instructions associated with data to achieve the operations detailed herein. In one example, processor(s) 1002 can transform an element or an article (e.g., data, information) from one state or thing to another state or thing. Any of potential processing elements, microprocessors, digital signal processor, baseband signal processor, modem, PHY, controllers, systems, managers, logic, and/or machines described herein can be construed as being encompassed within the broad term 'processor'.

In at least one embodiment, memory element(s) 1004 and/or storage 1006 is/are configured to store data, information, software, and/or instructions associated with computing device 1000, and/or logic configured for memory element(s) 1004 and/or storage 1006. For example, any logic described herein (e.g., control logic 1020) can, in various embodiments, be stored for computing device 1000 using any combination of memory element(s) 1004 and/or storage 1006. Note that in some embodiments, storage 1006 can be consolidated with memory element(s) 1004 (or vice versa), or can overlap/exist in any other suitable manner.

In at least one embodiment, bus 1008 can be configured as an interface that enables one or more elements of computing device 1000 to communicate in order to exchange information and/or data. Bus 1008 can be implemented with any architecture designed for passing control, data and/or information between processors, memory elements/storage, peripheral devices, and/or any other hardware and/or software components that may be configured for computing device 1000. In at least one embodiment, bus 1008 may be implemented as a fast kernel-hosted interconnect, potentially using shared memory between processes (e.g., logic), which can enable efficient communication paths between the processes.

In various embodiments, network processor unit(s) 1010 may enable communication between computing device 1000 and other systems, entities, etc., via network I/O interface(s) 1012 (wired and/or wireless) to facilitate operations discussed for various embodiments described herein. In various embodiments, network processor unit(s) 1010 can be configured as a combination of hardware and/or software, such as one or more Ethernet driver(s) and/or controller(s) or interface cards, Fibre Channel (e.g., optical) driver(s) and/or controller(s), wireless receivers/transmitters/transceivers, baseband processor(s)/modem(s), and/or other similar network interface driver(s) and/or controller(s) now known or hereafter developed to enable communications between computing device 1000 and other systems, entities, etc. to facilitate operations for various embodiments described herein. In various embodiments, network I/O interface(s) 1012 can be configured as one or more Ethernet port(s), Fibre Channel ports, any other I/O port(s), and/or antenna(s)/antenna array(s) now known or hereafter developed. Thus, the network processor unit(s) 1010 and/or network I/O interface(s) 1012 may include suitable interfaces for receiving, transmitting, and/or otherwise communicating data and/or information in a network environment.

I/O interface(s) 1014 allow for input and output of data and/or information with other entities that may be connected to computing device 1000. For example, I/O interface(s) 1014 may provide a connection to external devices such as a keyboard, keypad, mouse, a touch screen, and/or any other suitable input and/or output device now known or hereafter developed. In some instances, external devices can also include portable computer readable (non-transitory) storage media such as database systems, thumb drives, portable optical or magnetic disks, and memory cards. In still some instances, external devices can be a mechanism to display data to a user, such as, for example, a computer monitor, a display screen, or the like.

In various embodiments, control logic 1020 can include instructions that, when executed, cause processor(s) 1002 to perform operations, which can include, but not be limited to, providing overall control operations of computing device; interacting with other entities, systems, etc. described herein; maintaining and/or interacting with stored data, information, parameters, etc. (e.g., memory element(s), storage, data structures, databases, tables, etc.); combinations thereof; and/or the like to facilitate various operations for embodiments described herein.

The programs described herein (e.g., control logic 1020) may be identified based upon application(s) for which they are implemented in a specific embodiment. However, it should be appreciated that any particular program nomenclature herein is used merely for convenience; thus, embodiments herein should not be limited to use(s) solely described in any specific application(s) identified and/or implied by such nomenclature.

In various embodiments, entities as described herein may store data/information in any suitable volatile and/or non-volatile memory item (e.g., magnetic hard disk drive, solid state hard drive, semiconductor storage device, random access memory (RAM), read only memory (ROM), erasable programmable read only memory (EPROM), application specific integrated circuit (ASIC), etc.), software, logic (fixed logic, hardware logic, programmable logic, analog logic, digital logic), hardware, and/or in any other suitable component, device, element, and/or object as may be appropriate. Any of the memory items discussed herein should be construed as being encompassed within the broad term 'memory element'. Data/information being tracked and/or sent to one or more entities as discussed herein could be provided in any database, table, register, list, cache, storage, and/or storage structure: all of which can be referenced at any suitable timeframe. Any such storage options may also be included within the broad term 'memory element' as used herein.

Note that in certain example implementations, operations as set forth herein may be implemented by logic encoded in one or more tangible media that is capable of storing instructions and/or digital information and may be inclusive of non-transitory tangible media and/or non-transitory computer readable storage media (e.g., embedded logic provided in: an ASIC, digital signal processing (DSP) instructions, software [potentially inclusive of object code and source code], etc.) for execution by one or more processor(s), and/or other similar machine, etc. Generally, memory element(s) 1004 and/or storage 1006 can store data, software, code, instructions (e.g., processor instructions), logic, parameters, combinations thereof, and/or the like used for operations described herein. This includes memory element(s) 1004 and/or storage 1006 being able to store data, software, code, instructions (e.g., processor instructions), logic, parameters, combinations thereof, or the like that are executed to carry out operations in accordance with teachings of the present disclosure.

In some instances, software of the present embodiments may be available via a non-transitory computer useable medium (e.g., magnetic or optical mediums, magneto-optic mediums, CD-ROM, DVD, memory devices, etc.) of a stationary or portable program product apparatus, downloadable file(s), file wrapper(s), object(s), package(s), container(s), and/or the like. In some instances, non-transitory computer readable storage media may also be removable. For example, a removable hard drive may be used for memory/storage in some implementations. Other examples may include optical and magnetic disks, thumb drives, and smart cards that can be inserted and/or otherwise connected to a computing device for transfer onto another computer readable storage medium.

Variations and Implementations

Embodiments described herein may include one or more networks, which can represent a series of points and/or network elements of interconnected communication paths for receiving and/or transmitting messages (e.g., packets of information) that propagate through the one or more networks. These network elements offer communicative interfaces that facilitate communications between the network elements. A network can include any number of hardware and/or software elements coupled to (and in communication with) each other through a communication medium. Such networks can include, but are not limited to, any local area network (LAN), virtual LAN (VLAN), wide area network (WAN) (e.g., the Internet), software defined WAN (SD-WAN), wireless local area (WLA) access network, wireless wide area (WWA) access network, metropolitan area network (MAN), Intranet, Extranet, virtual private network (VPN), Low Power Network (LPN), Low Power Wide Area Network (LPWAN), Machine to Machine (M2M) network, Internet of Things (IoT) network, Ethernet network/switching system, any other appropriate architecture and/or system that facilitates communications in a network environment, and/or any suitable combination thereof.

Networks through which communications propagate can use any suitable technologies for communications including wireless communications (e.g., 4G/5G/nG, IEEE 802.11 (e.g., Wi-Fi®/Wi-Fi6®), IEEE 802.16 (e.g., Worldwide Interoperability for Microwave Access (WiMAX)), Radio-Frequency Identification (RFID), Near Field Communication (NFC), Bluetooth™ mm.wave, Ultra-Wideband (UWB), etc.), and/or wired communications (e.g., T1 lines, T3 lines, digital subscriber lines (DSL), Ethernet, Fibre Channel, etc.). Generally, any suitable means of communications may be used such as electric, sound, light, infrared, and/or radio to facilitate communications through one or more networks in accordance with embodiments herein. Communications, interactions, operations, etc. as discussed for various embodiments described herein may be performed among entities that may directly or indirectly connected utilizing any algorithms, communication protocols, interfaces, etc. (proprietary and/or non-proprietary) that allow for the exchange of data and/or information.

Communications in a network environment can be referred to herein as 'messages', 'messaging', 'signaling', 'data', 'content', 'objects', 'requests', 'queries', 'responses', 'replies', etc. which may be inclusive of packets. As referred to herein and in the claims, the term 'packet' may be used in a generic sense to include packets, frames, segments, datagrams, and/or any other generic units that may be used to transmit communications in a network environment. Generally, a packet is a formatted unit of data that can contain control or routing information (e.g., source and destination address, source and destination port, etc.) and data, which is also sometimes referred to as a 'payload', 'data payload', and variations thereof. In some embodiments, control or routing information, management information, or the like can be included in packet fields, such as within header(s) and/or trailer(s) of packets. Internet Protocol (IP) addresses discussed herein and in the claims can include any IP version 4 (IPv4) and/or IP version 6 (IPv6) addresses.

To the extent that embodiments presented herein relate to the storage of data, the embodiments may employ any number of any conventional or other databases, data stores or storage structures (e.g., files, databases, data structures, data or other repositories, etc.) to store information.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of can be represented using the'(s)' nomenclature (e.g., one or more element(s)).

In some aspects, the techniques described herein relate to a computer-implemented method including: receiving, from one or more devices under test, telemetry data during a hardware testing phase, the telemetry data including one or more telemetry parameters; processing the telemetry data using a predictive model to determine future values for the one or more telemetry parameters; and performing additional hardware testing, wherein the additional hardware testing includes adjusting one or more testing components based on the determined future values.

In some aspects, the techniques described herein relate to a computer-implemented method, wherein the one or more testing components are selected from a group of: a count of the one or more devices under test, and a duration of the hardware testing phase.

In some aspects, the techniques described herein relate to a computer-implemented method, wherein the predictive model indicates adjustments to the one or more testing components of the additional hardware testing.

In some aspects, the techniques described herein relate to a computer-implemented method, wherein the predictive model is trained using training data selected from a group of: telemetry data obtained from one or more previously-tested devices, and data obtained from one or more devices provided to customers.

In some aspects, the techniques described herein relate to a computer-implemented method, wherein the predictive model is trained using training data that is obtained by: identifying a plurality of clusters in time-series telemetry data obtained from a previous test; determining a distance of each cluster from an initial cluster corresponding to a starting point of the previous test; and labeling the time-series telemetry data with a label indicating the distance, from the initial cluster, of a cluster corresponding to each time-series telemetry datum.

In some aspects, the techniques described herein relate to a computer-implemented method, wherein the future values determined by the predictive model include predicted sensor data values for a full-length test for one or more sensors of the one or more devices under test.

In some aspects, the techniques described herein relate to a computer-implemented method, wherein the one or more telemetry parameters are selected from a group of: a temperature parameter, a voltage parameter, a pressure parameter, an electric current parameter, a capacitance parameter, a gyroscopic parameter, a microelectromechanical system parameter, a stress/strain parameter, a traffic rate parameter, a packet drop rate parameter, and an ambient environmental condition parameter.

In some aspects, the techniques described herein relate to a computer system including: one or more computer processors; one or more computer readable storage media; and program instructions stored on the one or more computer readable storage media for execution by at least one of the one or more computer processors, the program instructions including instructions to: receive, from one or more devices under test, telemetry data during a hardware testing phase, the telemetry data including one or more telemetry parameters; process the telemetry data using a predictive model to determine future values for the one or more telemetry parameters; and perform additional hardware testing, wherein the additional hardware testing includes adjusting one or more testing components based on the determined future values.

In some aspects, the techniques described herein relate to a computer system, wherein the one or more testing components are selected from a group of: a count of the one or more devices under test, and a duration of the hardware testing phase.

In some aspects, the techniques described herein relate to a computer system, wherein the predictive model indicates adjustments to the one or more testing components of the additional hardware testing.

In some aspects, the techniques described herein relate to a computer system, wherein the predictive model is trained using training data selected from a group of: telemetry data obtained from one or more previously-tested devices, and data obtained from one or more devices provided to customers.

In some aspects, the techniques described herein relate to a computer system, wherein the predictive model is trained using training data that is obtained by: identifying a plurality of clusters in time-series telemetry data obtained from a previous test; determining a distance of each cluster from an initial cluster corresponding to a starting point of the previous test; and labeling the time-series telemetry data with a label indicating the distance, from the initial cluster, of a cluster corresponding to each time-series telemetry datum.

In some aspects, the techniques described herein relate to a computer system, wherein the future values determined by the predictive model include predicted sensor data values for a full-length test for one or more sensors of the one or more devices under test.

In some aspects, the techniques described herein relate to a computer system, wherein the one or more telemetry parameters are selected from a group of: a temperature parameter, a voltage parameter, a pressure parameter, an electric current parameter, a capacitance parameter, a gyroscopic parameter, a microelectromechanical system parameter, a stress/strain parameter, a traffic rate parameter, a packet drop rate parameter, and an ambient environmental condition parameter.

In some aspects, the techniques described herein relate to a computer program product including one or more computer readable storage media collectively having program instructions embodied therewith, the program instructions executable by a computer to cause the computer to: receive, from one or more devices under test, telemetry data during a hardware testing phase, the telemetry data including one or more telemetry parameters; process the telemetry data using a predictive model to determine future values for the one or more telemetry parameters; and perform additional hardware testing, wherein the additional hardware testing includes adjusting one or more testing components based on the determined future values.

In some aspects, the techniques described herein relate to a computer program product, wherein the one or more testing components are selected from a group of: a count of the one or more devices under test, and a duration of the hardware testing phase.

In some aspects, the techniques described herein relate to a computer program product, wherein the predictive model indicates adjustments to the one or more testing components of the additional hardware testing.

In some aspects, the techniques described herein relate to a computer program product, wherein the predictive model is trained using training data selected from a group of: telemetry data obtained from one or more previously-tested devices, and data obtained from one or more devices provided to customers.

In some aspects, the techniques described herein relate to a computer program product, wherein the predictive model is trained using training data that is obtained by: identifying a plurality of clusters in time-series telemetry data obtained from a previous test; determining a distance of each cluster from an initial cluster corresponding to a starting point of the previous test; and labeling the time-series telemetry data with a label indicating the distance, from the initial cluster, of a cluster corresponding to each time-series telemetry datum.

In some aspects, the techniques described herein relate to a computer program product, wherein the future values determined by the predictive model include predicted sensor data values for a full-length test for one or more sensors of the one or more devices under test.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. A computer-implemented method comprising:
   receiving, from a plurality of devices under test, telemetry data during a hardware testing phase, the telemetry data including one or more telemetry parameters;
   processing the telemetry data using a predictive model to determine future values for the one or more telemetry parameters; and
   performing additional hardware testing, wherein the additional hardware testing includes adjusting one or more testing components based on the determined future values, wherein adjusting the one or more testing components includes reducing a count of the plurality of devices under test by omitting from the additional hardware testing one or more devices having future values that indicate that the one or more devices will pass the hardware testing phase.

2. The computer-implemented method of claim 1, wherein adjusting the one or more testing components further includes adjusting a duration of the hardware testing phase.

3. The computer-implemented method of claim 1, wherein the predictive model indicates adjustments to the one or more testing components of the additional hardware testing.

4. The computer-implemented method of claim 1, wherein the predictive model is trained using training data selected from a group of: telemetry data obtained from one or more previously-tested devices, and data obtained from one or more devices provided to customers.

5. The computer-implemented method of claim 1, wherein the predictive model is trained using training data that is obtained by:
   identifying a plurality of clusters in time-series telemetry data obtained from a previous test;
   determining a distance of each cluster from an initial cluster corresponding to a starting point of the previous test; and
   labeling the time-series telemetry data with a label indicating the distance, from the initial cluster, of a cluster corresponding to each time-series telemetry datum.

6. The computer-implemented method of claim 1, wherein the future values determined by the predictive model include predicted sensor data values for a full-length test for one or more sensors of the plurality of devices under test.

7. The computer-implemented method of claim 1, wherein the one or more telemetry parameters are selected from a group of: a temperature parameter, a voltage parameter, a pressure parameter, an electric current parameter, a capacitance parameter, a gyroscopic parameter, a microelectromechanical system parameter, a stress/strain parameter, a traffic rate parameter, a packet drop rate parameter, and an ambient environmental condition parameter.

8. A computer system comprising:
   one or more computer processors;
   one or more computer readable storage media; and
   program instructions stored on the one or more computer readable storage media for execution by at least one of the one or more computer processors, the program instructions comprising instructions to:
   receive, from a plurality of devices under test, telemetry data during a hardware testing phase, the telemetry data including one or more telemetry parameters;
   process the telemetry data using a predictive model to determine future values for the one or more telemetry parameters; and
   perform additional hardware testing, wherein the additional hardware testing includes adjusting one or more testing components based on the determined future values, wherein adjusting the one or more testing components includes reducing a count of the plurality of devices under test by omitting from the additional hardware testing one or more devices having future values that indicate that the one or more devices will pass the hardware testing phase.

9. The computer system of claim 8, wherein adjusting the one or more testing components further includes adjusting a duration of the hardware testing phase.

10. The computer system of claim 8, wherein the predictive model indicates adjustments to the one or more testing components of the additional hardware testing.

11. The computer system of claim 8, wherein the predictive model is trained using training data selected from a group of: telemetry data obtained from one or more previously-tested devices, and data obtained from one or more devices provided to customers.

12. The computer system of claim 8, wherein the predictive model is trained using training data that is obtained by:
   identifying a plurality of clusters in time-series telemetry data obtained from a previous test;
   determining a distance of each cluster from an initial cluster corresponding to a starting point of the previous test; and
   labeling the time-series telemetry data with a label indicating the distance, from the initial cluster, of a cluster corresponding to each time-series telemetry datum.

13. The computer system of claim 8, wherein the future values determined by the predictive model include predicted sensor data values for a full-length test for one or more sensors of the plurality of devices under test.

14. The computer system of claim 8, wherein the one or more telemetry parameters are selected from a group of: a temperature parameter, a voltage parameter, a pressure parameter, an electric current parameter, a capacitance parameter, a gyroscopic parameter, a microelectromechanical system parameter, a stress/strain parameter, a traffic rate parameter, a packet drop rate parameter, and an ambient environmental condition parameter.

15. A computer program product comprising one or more non-transitory computer readable storage media collectively having program instructions embodied therewith, the program instructions executable by a computer to cause the computer to:
   receive, from a plurality of devices under test, telemetry data during a hardware testing phase, the telemetry data including one or more telemetry parameters;

process the telemetry data using a predictive model to determine future values for the one or more telemetry parameters; and perform additional hardware testing, wherein the additional hardware testing includes adjusting one or more testing components based on the determined future values, wherein adjusting the one or more testing components includes reducing a count of the plurality of devices under test by omitting from the additional hardware testing one or more devices having future values that indicate that the one or more devices will pass the hardware testing phase.

16. The computer program product of claim 15, wherein adjusting the one or more testing components further includes adjusting a duration of the hardware testing phase.

17. The computer program product of claim 15, wherein the predictive model indicates adjustments to the one or more testing components of the additional hardware testing.

18. The computer program product of claim 15, wherein the predictive model is trained using training data selected from a group of: telemetry data obtained from one or more previously-tested devices, and data obtained from one or more devices provided to customers.

19. The computer program product of claim 15, wherein the predictive model is trained using training data that is obtained by:
- identifying a plurality of clusters in time-series telemetry data obtained from a previous test;
- determining a distance of each cluster from an initial cluster corresponding to a starting point of the previous test; and
- labeling the time-series telemetry data with a label indicating the distance, from the initial cluster, of a cluster corresponding to each time-series telemetry datum.

20. The computer program product of claim 15, wherein the future values determined by the predictive model include predicted sensor data values for a full-length test for one or more sensors of the plurality of devices under test.

* * * * *